United States Patent [19]

Jinbo

[11] Patent Number: 5,305,273
[45] Date of Patent: Apr. 19, 1994

[54] SEMICONDUCTOR MEMORY DEVICE
[75] Inventor: Toshikatsu Jinbo, Tokyo, Japan
[73] Assignee: NEC Corporation, Tokyo, Japan
[21] Appl. No.: 942,606
[22] Filed: Sep. 10, 1992
[30] Foreign Application Priority Data
   Oct. 9, 1991 [JP]  Japan .................................. 3-258410
[51] Int. Cl.⁵ .............................................. G11C 11/40
[52] U.S. Cl. .................................................. 365/210
[58] Field of Search ........... 365/210, 207, 208, 189.07, 365/189.09

[56]            References Cited
            U.S. PATENT DOCUMENTS
   4,802,138  1/1989  Shimamune ......................... 365/210
   4,974,207  11/1990  Hashimoto .......................... 365/210
   5,040,148  8/1991  Nakai .................................. 365/207

Primary Examiner—Eugene R. LaRoche
Assistant Examiner—A. Zarabian
Attorney, Agent, or Firm—Sughrue, Mion, Zinn, Macpeak & Seas

[57]  ABSTRACT

A semiconductor memory device has a matrix of memory cells interconnected by a plurality of column and row lines to form a channel between one of the column lines and a voltage source corresponding to a specified status. A sensing circuit connects or disconnects an output node where the current is supplied from the voltage source with the input node which indicates the status of the specified memory cell. A reference voltage generation circuit generates the reference voltage. A comparison circuit generates a signal to indicate the specified status of the selected memory cell. Between the output and input nodes of the sensing circuit, a first transistor under gate control by a reverse voltage of the input node voltage is connected and between the input node of the sensing circuit and the input node of the reference voltage generation circuit, a second transistor under gate control by the reverse voltage is also provided. The column line of the selected memory cell is charged by the voltage source of the sensing circuit via the first transistor and also by the voltage source of the reference voltage generation circuit via the second transistor.

5 Claims, 8 Drawing Sheets

SEMICONDUCTOR MEMORY DEVICE

BACKGROUNDS OF THE INVENTION

1. Field of the Invention

This invention relates to a semiconductor memory device, and in particular relates to a semiconductor memory device featuring high speed data reading realized by higher speed charging up of column lines.

2. Description of the Prior Art

Semiconductor memory devices include the non-volatile semiconductor memory device using as its memory devices MOS type field effect transistors (hereinafter "MOS FET") having double gate structure with a floating gate and a control gate.

FIG. 8 is a cross sectional view of such a MOS FET, and FIG. 9 shows its symbolized view. The MOS FET is provided with N-channel type source-drain diffusion layers 82 and 83 on a P-channel type substrate 81 and a floating gate 84 electrically insulated from outside and a control gate 85 for switching control both in an insulation layer (not shown) on the substrate. When the floating gate 84 is electrically neutral (hereinafter "non-write status"), the MOS FET becomes conductive under low control gate voltage (2 V, for example) as shown by 101 in FIG. 10. However, if high voltage (12.5 V, for example) is applied to the control gate 85 and the drain 83, electrons are supplied to the floating gate 84, which results in higher threshold voltage at memory devices seen from the control gate 85 (hereinafter called "write status"). In this case, the MOS FET becomes conductive only when high voltage (7 V, for example) as shown by 102 in FIG. 10 is applied to the control gate 85. Such a change in threshold voltage is utilized for data storage.

FIG. 6 is a schematic diagram to show the configuration of a conventional non-volatile semiconductor memory device using memory devices comprising MOS FETs as described above.

This semiconductor memory device has a memory array 40 comprising a plurality of column lines D1 to Dn connected to the drains of a plurality of memory devices MC11 to MCmn and a plurality of row lines SX1 to SXm serving as common gate electrodes for the memory devices on the column lines D1 to Dn.

The row lines SX1 to SXm control switching among memory devices according to row selection signals from a row decoder 41. The column lines D1 to Dn are connected to an input terminal SIN4 of a sensing circuit 44 via a column selection circuit 42 consisting of N-channel type MOS FETs MY1 to MYn, which are in turn controlled for switching according to column selection signals SY1 to SYn from a column decoder 43.

The sensing circuit 44 has its input terminal SIN4 connected with both the source of an N-channel type MOS FET MN41 and the input of an inverter circuit INV41, and the inverter circuit INV41 has its output VO4 connected with the gate of the above N-channel type MOS FET MN41. A P-channel type MOS FET MP41 serving as a load MOS FET has its source connected with the power supply VC and its gate and drain connected with the drain of the N-channel type MOS FET MN41. From the contact N400 where the gate and drain of the P-channel type MOS FET MP41 and the drain of the N-channel type MOS FET MN41 are connected, the output Vsa4 of the sensing circuit 44 is output.

A reference voltage generation circuit 45 has a configuration similar to the sensing circuit 44 with an N-channel type MOS FET MN42, an inverter circuit INV42 and a P-channel type MOS FET MP42. Input is provided to a reference memory device MCR4 equivalent to the memory devices MC11 to MCmn via an N-channel type MOS FET MYR4 equivalent to the N-channel type MOS FETs MY1 to MYn constituting the column selection circuit 42. The reference voltage generation circuit 45 generates reference voltage Vra4. A comparison amplifier 46 compares the output Vsa4 from the sensing circuit 44 with the output Vra4 from the reference voltage generation circuit 45 and outputs the result data output DAT4.

Now, the data reading operation is described. Suppose the memory device MC11 in the memory array 40 is selected.

If this selected memory device MC11 is in non-write status, the column line D1 and the input SIN4 of the sensing circuit 44 are discharged via the memory device MC11. This lowers the potential at the input SIN4 of the sensing circuit 44, which causes the output VO4 at the inverter circuit INV41 to have higher voltage and the N-channel type MOS FET MN41 to become conductive. Accordingly, the potential of the output Vsa4 from the sensing circuit 44 becomes low.

On the other hand, if the selected memory device MC11 is in write status, the column line D1 and the input SIN4 of the sensing circuit 44 are charged via the P-channel type MOS FET MP41 and the N-channel type MOS FET MN41. This increases the potential at the input SIN4 of the sensing circuit 44, causing the output VO4 at the inverter circuit INV41 to become low and the N-channel type MOS FET MN41 to become non-conductive. This results in high level output Vsa4 at the sensing circuit 44 under the effect of the P-channel type MOS FET MP41.

In the reference voltage generation circuit 45, the reference memory device MCR4 connected to its input RIN4 is in non-write status and its gate terminal connected to the power supply VC is conductive. Accordingly, the output Vra4 of the reference voltage generation circuit 45 is at low level as in the case of sensing circuit 44.

The output Vsa4 of the sensing circuit 44 thus changing depending on the status of the selected memory device is compared with the potential at the output Vra4 of the reference voltage generation circuit 45 by the comparison amplifier 46 so as to obtain the output DAT4 corresponding to the status of the selected memory device.

In a conventional semiconductor memory device, if a memory device in write status is selected, proper data is output only when the potential of the selected column line and the sensing circuit 44 are charged via the P-channel type MOS FET MP41 and the N-channel type MOS FET MN41, the output VO4 of the inverter circuit INV41 becomes low, the N-channel type MOS FET MN41 becomes non-conductive and the output Vsa4 of the sensing circuit 44 is brought to high level by the P-channel type MOS FET MP41.

For example, as shown by the voltage waveform in FIG. 7, if the column selection signals SY1 and SYn changes at the time T71 with shifting from the selection of a memory device in non-write status on the column line D1 to the selection of another memory device in write status on the column line Dn, the data output DAT4 is at high level during charging of the newly selected column line Dn (the period from the time T71 to T72) and becomes low upon completion of charging of the column line Dn (at T72). For this reason, when many memory devices are connected to each of the column lines D1 to Dn, causing large capacity to depend on the column lines, charging of the column lines D1 to Dn requires long time, which results in long time required for data reading.

SUMMARY OF THE INVENTION

An object of the present invention is to provide a semiconductor memory device realizing high speed data reading by reducing the time required for charging of the selected column line.

According to a preferred embodiment of the present invention to attain this object, a semiconductor memory device comprises memory cells in matrix connection with a plurality of column and row lines to form a channel between one of the column lines and the voltage source corresponding to the specified status, a column selection means to select any of the column lines, a row selection means to select any of the row lines, a sensing means to connect or disconnect the output node where the current is supplied from the voltage source with or from the input node corresponding to the specified status of the memory cell selected by selection of the column and row lines, a reference voltage generation means to connect the input node where the reference memory cell and a circuit device equivalent to those constituting the column selection means with the output node where the current is supplied from the voltage source and to generate the reference voltage at the output node, and a comparison means to compare the voltage at the output node of the sensing means with the reference voltage from the reference voltage generating means and to issue a signal to show the specified status of the selected memory cell, and is characterized by that a first transistor under gate control by the reverse voltage of the input node voltage is connected between the output and input nodes of the sensing means and that a second transistor under gate control by the reverse voltage is connected between the input node of the sensing means and the input node of the reference voltage generation means.

According to another preferred embodiment, a third transistor under gate control by the reverse voltage of the input node is connected between the output node and the input node of the reference voltage generation means.

According to still another preferred embodiment, the second transistor has a threshold value smaller than that of the first or third transistor in order for stable operation.

According to a preferred embodiment, the first, second and third transistors are N-channel type field effect transistors.

According to further preferred embodiment, the first and third transistors are intrinsic transistors having a threshold voltage of about 0 V and the second transistor is an enhancement transistor.

DESCRIPTION OF THE PREFERRED EMBODIMENT

Referring to the attached figures, preferred embodiments of the semiconductor memory device according to the present invention will be described.

Figure 1:
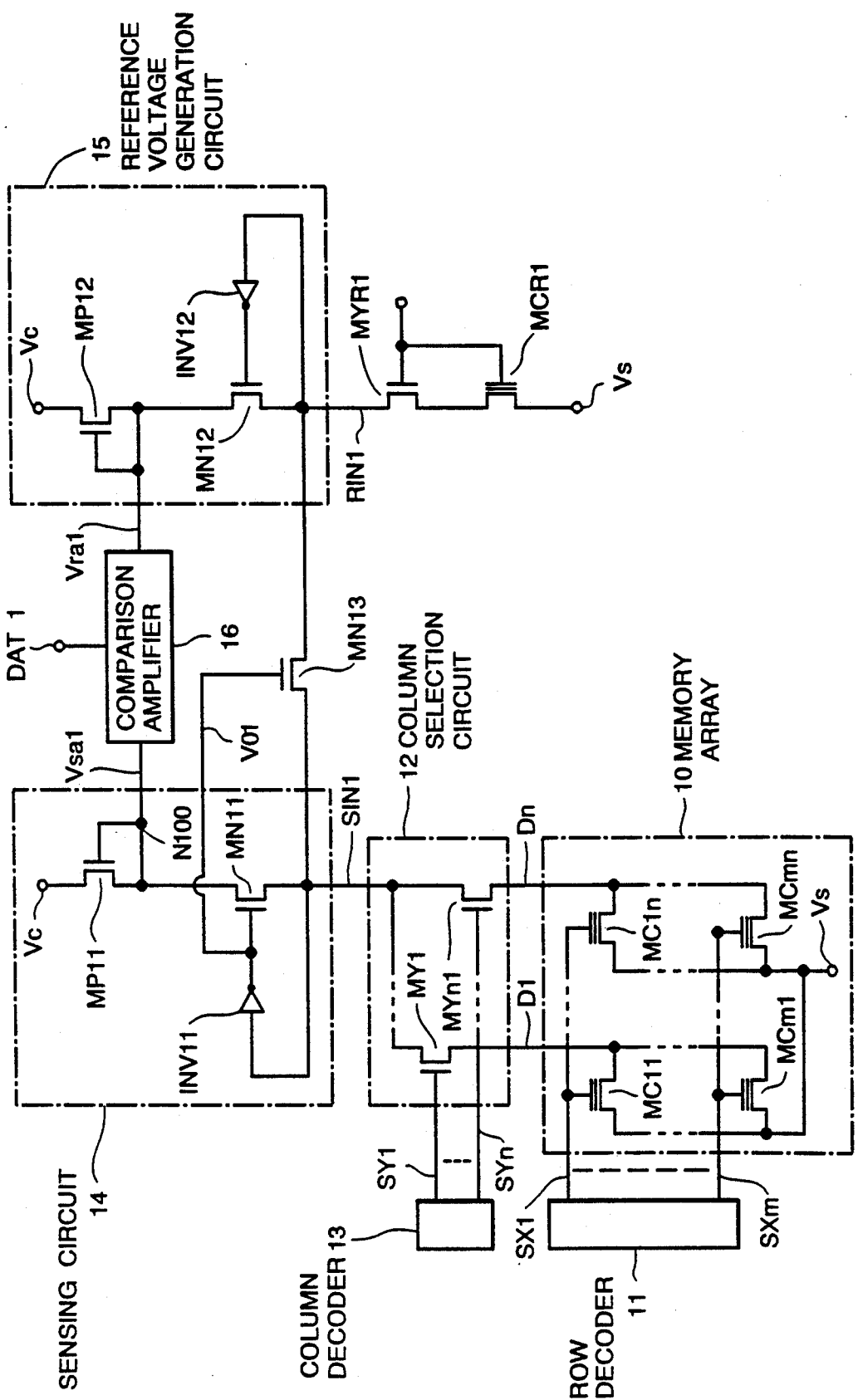
FIG. 1 is a schematic diagram to show the configuration of a semiconductor memory device according to a first embodiment of the present invention.

FIG. 1 is a schematic diagram to show the configuration of a semiconductor memory device according to a first embodiment of the present invention.

This semiconductor device is a non-volatile memory device using MOS FETs as memory devices. It has a memory array 10 comprising a plurality of memory devices MC11 to MCmn, a plurality of column lines D1 to Dn connected to the drains of the memory devices MC11 to MCmn and a plurality of row lines SX1 to SXm serving as common gate electrodes for the memory devices MC11 to MCmn on the column lines D1 to Dn.

The row lines SX1 to SXm serve for switching control of memory devices MC11 to MCmn according to row selection signals from a row decoder 11. The column lines D1 to Dn are connected to an input terminal SIN1 of a sensing circuit 14 via a column selection circuit 12 consisting of N-channel type MOS FETs MY1 to MYn, which are controlled for switching according to the column selection signals SY1 to SYn from a column decoder 13.

The sensing circuit 14 has its input terminal SIN1 connected with both the source of an N-channel type MOS FET MN11 and the input of the inverter circuit INV11, and the output VO1 of the inverter circuit INV11 is connected with the gate of the above N-channel type MOS FET MN11. A P-channel type MOS FET MP11 serving as a load MOS FET has its source connected with the power supply VC and its gate and drain connected with the drain of the N-channel type MOS FET MN11. From the contact N1OO where the gate and drain of the P-channel type MOS FET MP11 and the drain of the N-channel type MOS FET MN11 are connected, the output Vsa1 of the sensing circuit 14 is output.

A reference voltage generation circuit 15 has a configuration similar to the sensing circuit 14; it comprises an N-channel type MOS FET MN12, an inverter circuit INV12 and a P-channel type MOS FET MP12. Input is provided to a reference memory device MCR1 equivalent to the memory devices MC11 to MCmn via an N-channel type MOS FET MYR1 equivalent to the N-channel type MOS FETs MY1 to MYn constituting the column selection circuit 12. The reference voltage generation circuit 15 generates reference voltage Vra1.

A comparison amplifier 16 compares the output Vsa1 from the sensing circuit 14 with the output Vra1 from the reference voltage generation circuit 15 and outputs the result data output DAT1.

The semiconductor memory device of this embodiment is further provided with an N-channel type MOS FET MN13 between the input SIN1 of the sensing circuit 14 and the input RIN1 of the reference voltage generation circuit 15. The gate of this N-channel type MOS FET MN13 is connected with the output VO1 of the inverter circuit INV11.

Now, the operation of the device according to this embodiment configured as above is now described. If the memory device MC11 in the memory array 10 is selected, the row decoder 11 selects the row line SX1 and the column decoder 13 selects the N-channel type MOS FET MY1 and the column line D1. As a result, the memory device MC11 disposed on the intersection of the selected row line SX1 and the column line D1 is selected.

Referring first to the reference voltage generation circuit 15, since the reference memory device MCR1 connected with the input RIN1 is in non-write status and its gate is connected with the power supply VC causing it to be conductive, the output reference voltage Vra1 is at low level.

If the selected memory devices MC11 to MCmn are in non-write status, the input SIN1 of the sensing circuit 14 is discharged by the selected memory device and becomes low level. Low potential at the input SIN1 of the sensing circuit 14 causes the output VO1 of the inverter circuit INV11 to be high level, and the N-channel type MOS FET MN11 to become conductive. Accordingly, the output Vsa1 of the sensing circuit 14 is at low level.

At this point, the gate of the N-channel type MOS FET MN13 also becomes high level. However, since the selected memory device and the reference memory device have the same characteristics, the input SIN1 of the sensing circuit 14 and the input RIN1 of the reference voltage generation circuit 15 are at the same (low) voltage level. This results in no current flow via the N-channel type MOS FET MN13. Accordingly, the output Vsa1 of the sensing circuit 14 and the output Vra1 of the reference voltage generation circuit 15 are both at low level.

On the other hand, if the selected memory device is in write status, the input SIN1 of the sensing circuit 14 is charged via the P-channel type MOS FET MP11 and the N-channel type MOS FET MN11 and becomes high level. Increase of the potential at the input SIN1 of the sensing circuit 14 causes the output VO1 of the inverter circuit INV11 to be low. This results in that the N-channel type MOS FET MN11 becomes non conductive and the output Vsa1 of the sensing circuit 14 is brought to high level by the P-channel type MOS FET MP11.

At this point, the input SIN1 of the sensing circuit 14 has higher voltage than the input RIN1 of the reference voltage generation circuit 15, but the gate voltage of the N-channel type MOS FET MN13 is at low level and the potential difference between its source and drain is small, which results in little current flow. Therefore, the output Vsa1 of the sensing circuit 14 is at high level and the output Vra1 of the reference voltage generation circuit 15 is at low level.

The comparison amplifier 16 compares the potentials at the output Vsa1 of the sensing circuit 14 which changes depending on the status of the selected memory device and the output Vra1 of the reference voltage generation circuit 15 so as to output DAT1 corresponding to the status of the memory device. Specifically, it provides high level output DAT1 when the selected memory device is in non-write status and low level output DAT1 when it is in write status.

Figure 3:
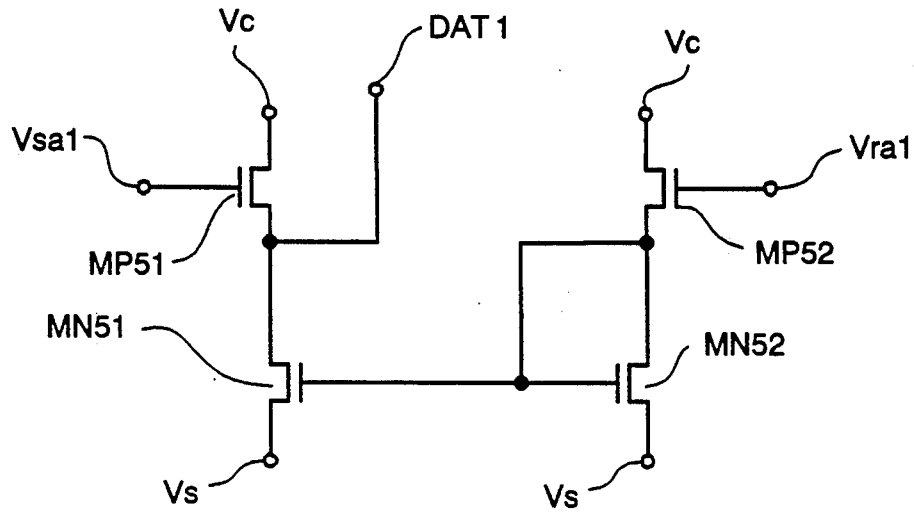
FIG. 3 is a schematic diagram to show the configuration of a comparison amplifier.

The comparison amplifier 16 is now described in detail. FIG. 3 is a schematic diagram to show the configuration of the comparison amplifier. This comparison amplifier 16 comprises a P-channel type MOS FET MP51 and an N-channel type MOS FET MN51 connected in series, and another P-channel type MOS FET MP52 and another N-channel type MOS FET MN52 also connected in series. The sources of the P-channel type MOS FETs MP51 and MP52 are connected with the power supply VC. The sources of the N-channel type MOS FETs MN51 and MN52 are connected with the grounding potential VS. The gate of the N-channel type MOS FET MN51 is connected with the gate and drain of the N-channel type MOS FET MN52. The output Vsa1 of the sensing circuit 14 and the output Vra1 of the reference voltage generation circuit 15 are supplied to the gates of the P-channel type MOS FETs MP51 and MP52 respectively. The data output DAT1 is obtained at the contact of the P-channel type MOS FET MP51 and the N-channel type MOS FET MN51.

Figure 4:
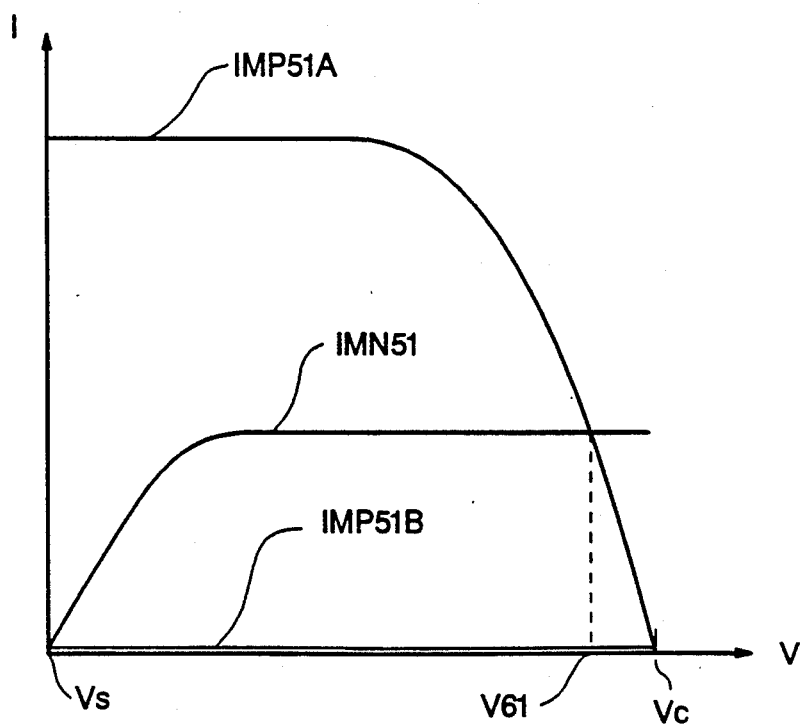
FIG. 4 is a diagram to show the characteristics of the comparison amplifier of FIG. 3.

Next, referring to the characteristics diagram of FIG. 4, the operation of this comparison amplifier is described. The sensing circuit 14 and the reference voltage generation circuit 15 are set so that their outputs Vsa1 and Vra1 become equal when the selected memory device is in non-write status. The P-channel type MOS FETs MP51 and MP52 of the comparison amplifier are set to have the equivalent characteristics. Desired characteristics are realized by setting the mutual transfer conductance of the N-channel type MOS FETs MN51 and MN52 constituting a current mirror.

For example, suppose the device is so set that gm (MN52)=½ gm (MN51) when both of the N-channel type MOS FETs MN51 and MN52 has mutual transfer conductance of gm.

If the current supplied to the P-channel type MOS FET MP51 when the selected memory device is in non-write status is IMP51A shown in FIG. 4, the current supplied to the N-channel type MOS FET MN51 is a half of IMP51A as shown by IMN51, and as the data output DAT1, high level output at the intersection V61 of the IMN51A and the IMN51 is obtained.

When the selected memory device is in write status, no current flows at the P-channel type MOS FET MP51 as shown by IMP51B in FIG. 4. In this case, the data output DAT1 obtained at the intersection of IMP51B and IMN51 is low substantially equivalent to the grounding potential VS.

Figure 2:
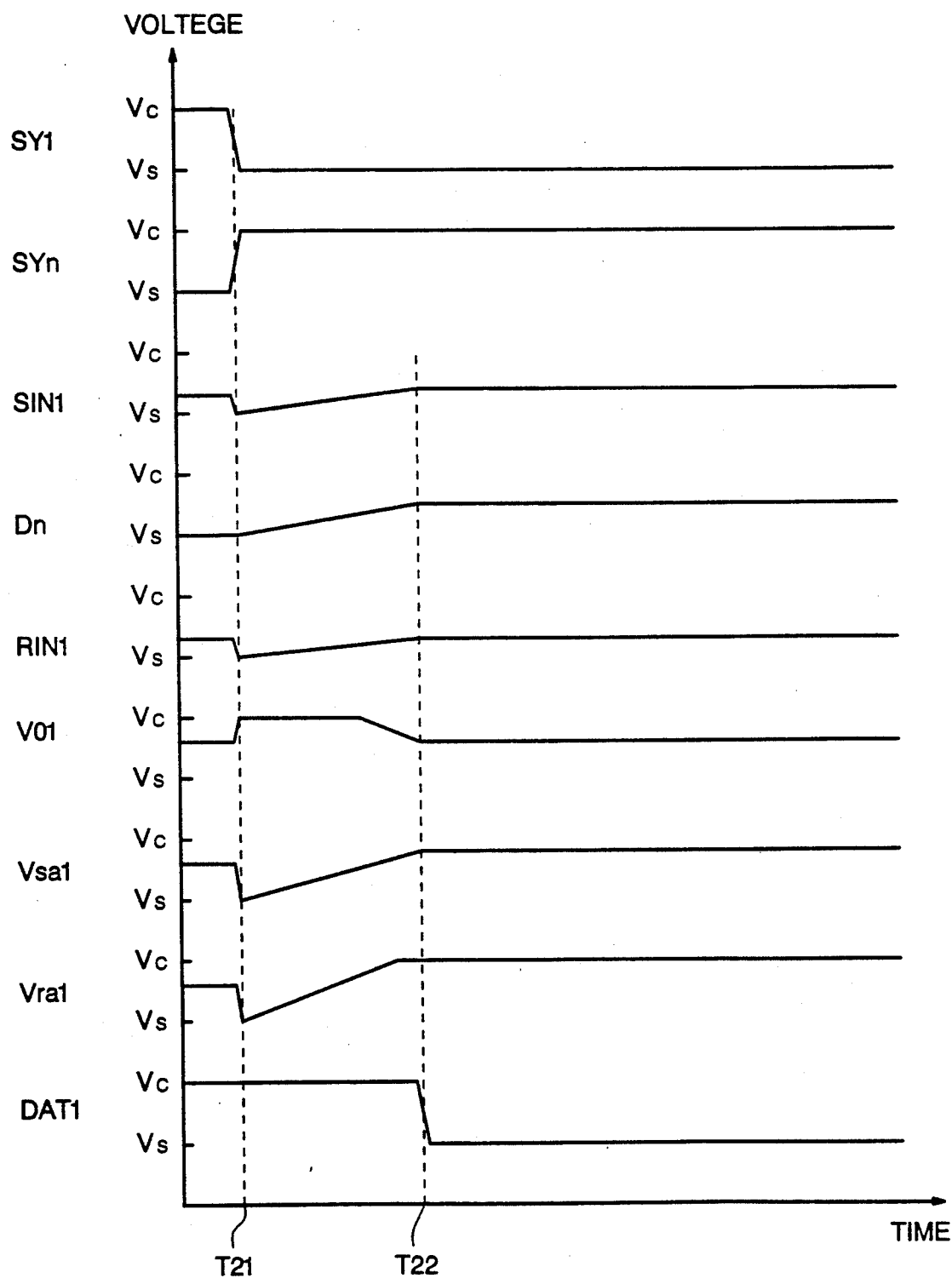
FIG. 2 is a diagram showing the voltage waveform to illustrate the operation for memory device switching in the semiconductor memory device of FIG. 1.

Referring now to the voltage waveforms shown in FIG. 2, switching from a memory device in non-write status on the column line D1 to another memory device in write status on the column line Dn is described. In FIG. 2, it is supposed that the voltage at the voltage source VC is about 5 V, and the output Vsa1 of the sensing circuit 14 is about 4 V at the high level and about 3 V at the low level.

At the time T21, the column selection signal SY1 is switched to the column selection signal SYn with selecting the column line Dn, the input SIN1 of the sensing circuit 14 becomes low level and the output VO1 of the inverter circuit INV11 becomes high and the N-channel type MOS FET MN11 becomes conductive.

As a result, via the P-channel type MOS FET MP11 and the N-channel type MOS FET MN11, the column line Dn is charged. At the same time, the N-channel type MOS FET MN13 also becomes conductive since the gate voltage becomes high level, and the column line Dn is charged via the P-channel type MOS FET MP12 and the N-channel type MOS FETs MN12 and MN13 of the reference voltage generation circuit 15. Such charging of the column line Dn using both of the voltage sources for the P-channel type MOS FETs MP11 and MP12 realizes higher speed charging than before, enabling completion in a short period. This results in high speed reading.

Figure 6:
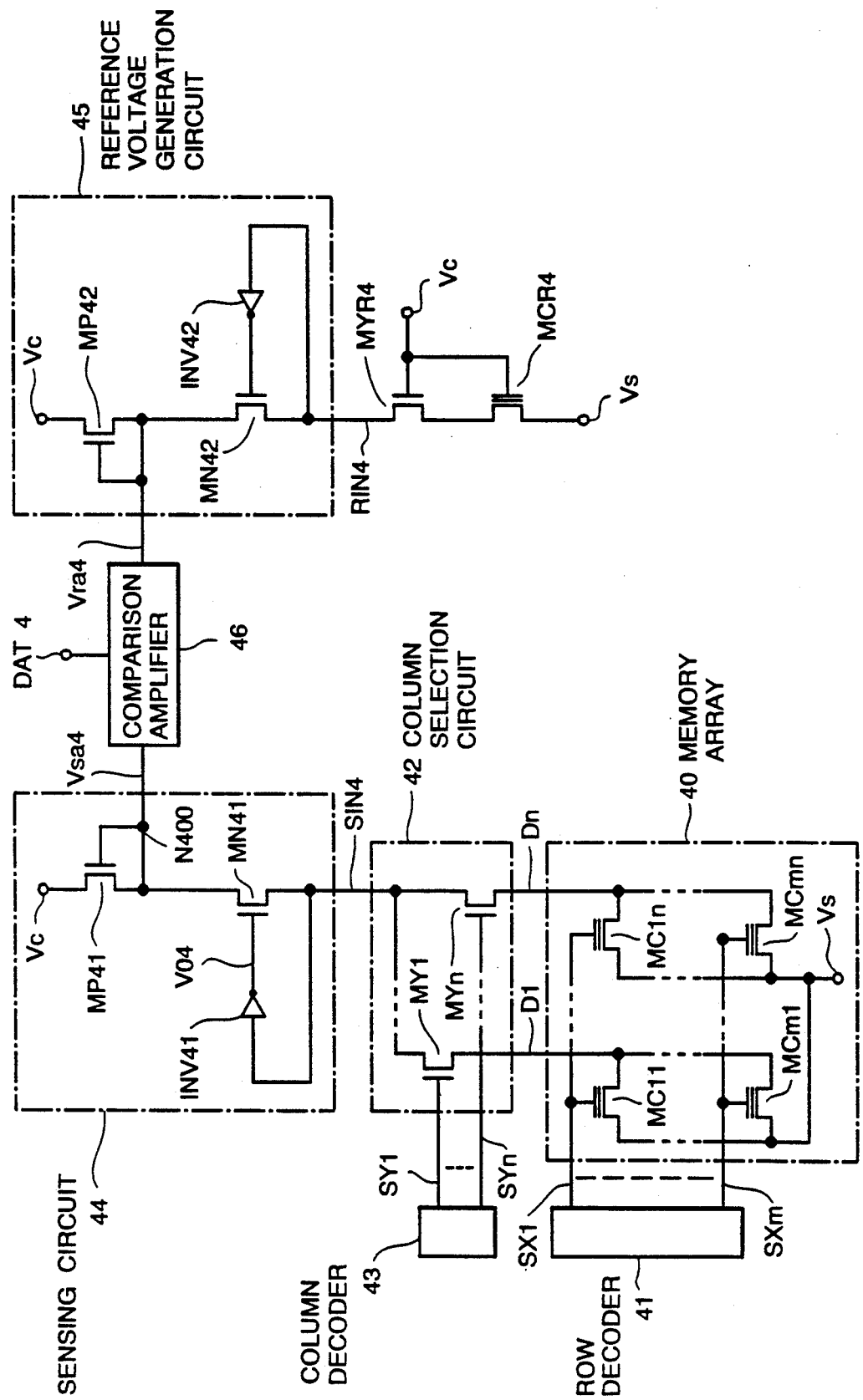
FIG. 6 is a schematic diagram to show the configuration of a conventional semiconductor memory device.
Figure 7:
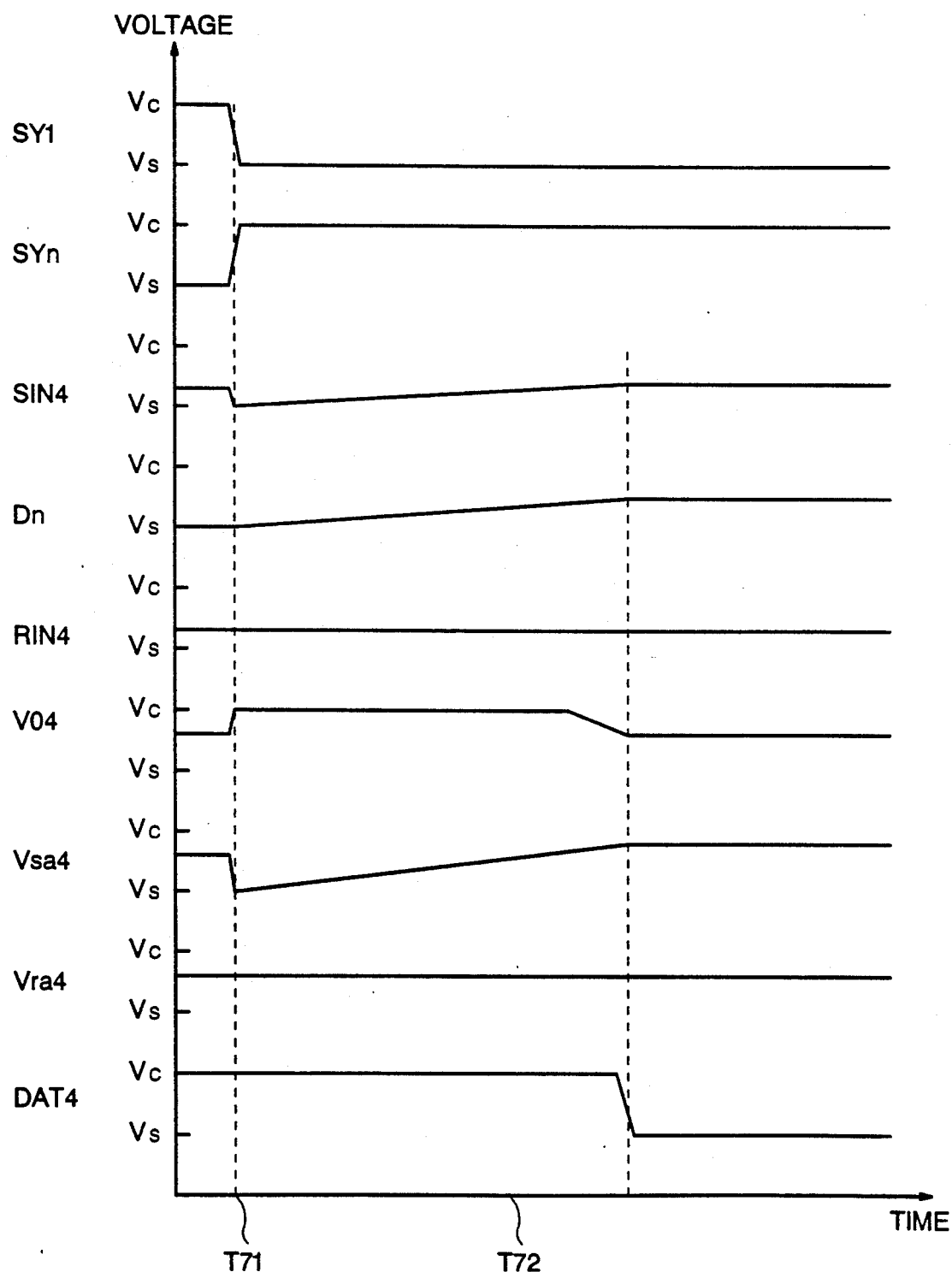
FIG. 7 is a diagram showing the voltage waveform to illustrate the operation for memory device switching in the semiconductor memory device of FIG. 6.
Figure 8:
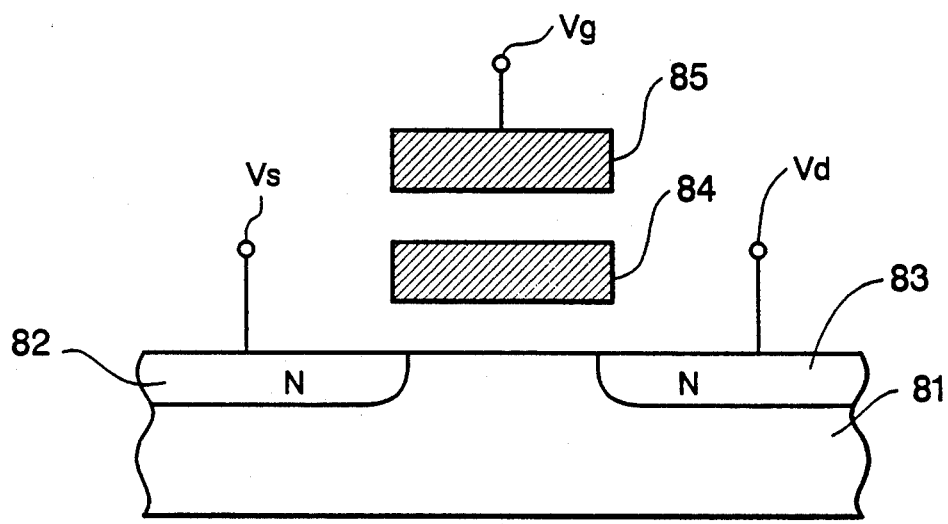
FIG. 8 is a cross sectional view of a memory device having a double gate structure.
Figure 9:
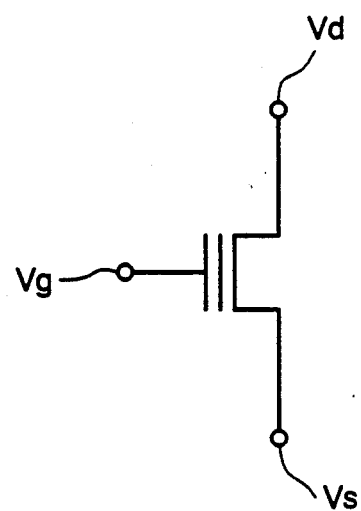
FIG. 9 is a symbolized diagram of the memory device shown in FIG. 8.
Figure 10:
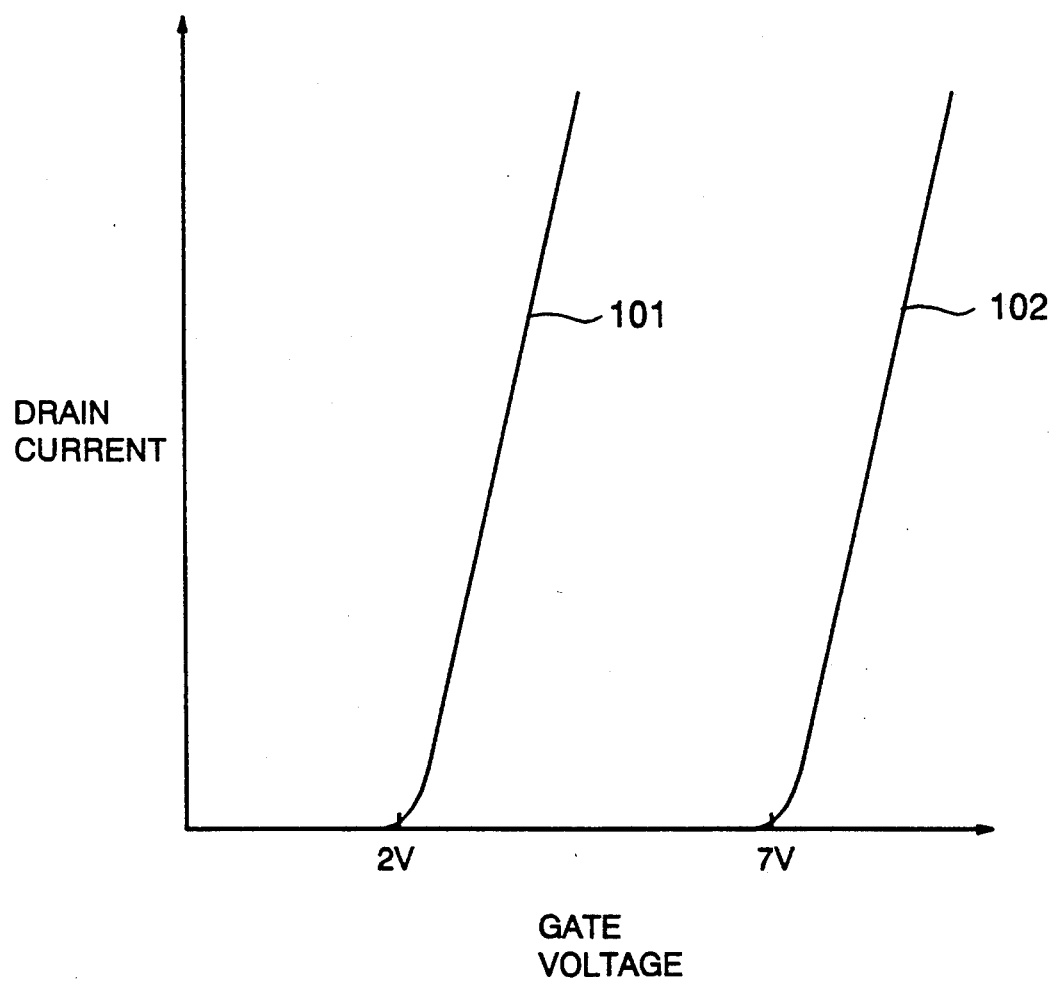
FIG. 10 is a diagram to show the characteristics of the memory device shown in FIG. 8.

The time required for charging of this column line Dn is now described using specific values. Suppose, for example, that the depending capacity of the column line is 10 pF, the potential difference of the column line Dn before and after charging is 2 V, and the average current the sensing circuit 14 supplies during charging is 1 mA. The average current supplied from the reference voltage generation circuit 15 is slightly less than that from the sensing circuit 14 because it is via the N-channel type MOS FET MN13 and is 0.8 A. With a conventional device shown in FIG. 6, charging of the column line Dn is performed only by the sensing circuit and the time required for charging is $$10 \times 10^{-12}(F) \times 2(V)/1 \times 10^{-3}(A) = 20^{-9} = 20 \text{ nsec.}$$

In this embodiment, since the column line Dn is charged by both sensing circuit 14 and the reference voltage generation circuit 15, the time required for charging (time from T21 to T22) is $10 \times 10^{-12}(F) \times 2(V)/(1 \times 10^{-3}(A) + 0.8 \times 10^{-3}(A)) = 11^{-9} = 11$ nsec. The charging is completed in about 11 nsec, which is 9 nsec shorter than the time required in the conventional device; it means that the column line Dn is charged at a substantially doubled speed. This realizes high speed data reading.

Figure 5:
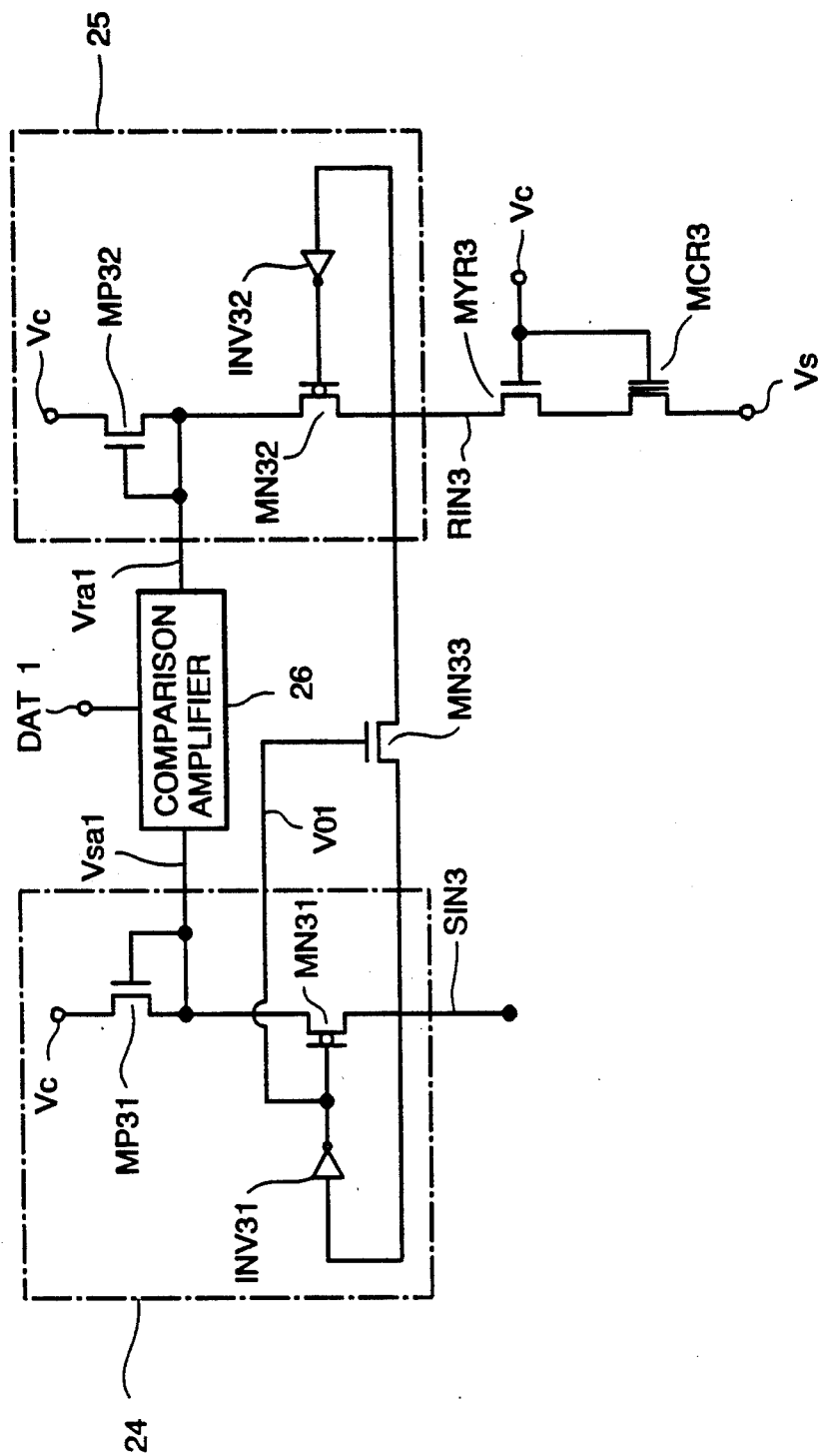
FIG. 5 is a schematic diagram to show the configuration of a semiconductor memory device according to a second embodiment of the present invention.

FIG. 5 is a schematic diagram to show the configuration of a semiconductor memory device according to a second embodiment of the present invention. In the second embodiment, a sensing circuit 24 and a reference voltage generation circuit 25 have the same circuit configuration as the first embodiment shown in FIG. 1, except that an N-channel type MOS FET MN31 of the sensing circuit 24 and an N-channel type MOS FET MN32 of the reference voltage generation circuit 25 comprise intrinsic transistors having a threshold voltage of about 0 V and that still another N-channel type MOS FET MN33 provided between the input SIN3 of the sensing circuit and the input RIN3 of the reference voltage generation circuit 25 comprises an enhancement transistor (usually having a threshold voltage of about 0.4 to 1.0 V).

The parts other than the sensing circuit 24 and the reference voltage generation circuit 25 are omitted but they are exactly the same as the configuration of the first embodiment as shown in FIG. 1. Accordingly, the sensing circuit 24 is connected with column lines D1 to Dn via a column selection circuit.

In the device according to the second embodiment, the circuit operation is similar to that in the first embodiment as described above. Accordingly, the selected column line can be charged rapidly.

In the second embodiment, when a memory device in write status is selected, even if there is a large potential difference between the input SIN3 of the sensing circuit 24 and the input RIN3 of the reference voltage generating circuit 25, the current does not flow from the input SIN3 of the sensing circuit 24 to the input RIN3 of the reference voltage generation circuit 25 via the N-channel type MOS FET MN33, enabling stable operation.

Suppose the voltage at the input SIN3 of the sensing circuit 24 when the memory device in write status is selected is V SIN, the voltage at the input RIN3 of the reference voltage generation circuit 25 is V RIN, the threshold voltages of the N-channel type MOS FETs MN31 and MN33 are V T31 and V T33 respectively.

The gate voltage VG (MN31) when the N-channel type MOS FET MN31 becomes non-conductive is VG (MN31)=V SIN +V T31. In addition, when V SIN >V RIN, the gate voltage VG (MN33) when the N-channel type MOS FET MN33 is conductive is VG (MN33)=V RIN+V T33.

To make the N-channel type MOS FET MN31 non-conductive and the N-channel type MOS FET MN33 conductive, the right sides of the above two equations need to be equal, or V SIN +V T31=V RIN+V T33. Suppose here that the V T31=0.1 V and V T33=0.8 V, the above equation can be changed to V SIN −V RIN=V T33−V T31=0.8−0.1=0.7 V.

Thus, in the second embodiment, the N-channel type MOS FET MN33 becomes conductive only when the potential difference between the input SIN3 of the sensing circuit 24 and the input RIN3 of the reference voltage generation circuit 25 is 0.7 V or more. This results in stable operation.

Obviously various modifications can be made to the above embodiments. It is intended to cover in the appended claims all such modifications as fall within the true spirit and scope of the present invention.

What is claimed is:

1. A semiconductor memory device comprising:
 memory cells in matrix connection with a plurality of column and row lines to form a channel between one of the column lines and a voltage source corresponding to a specified status, a column selection means to select any of said column lines, a row selection means to select any of said row lines, a sensing means for connecting an output node thereof with the input node thereof, said sensing means input node indicating the specified status of a memory cell selected by selection of said column and row lines, a reference voltage generation means for connecting an input node thereof, said reference voltage generation means input node being also connected to a reference memory cell through a reference memory cell selection circuit, with an output node thereof and for generating a reference voltage at said output node, and a comparison means to compare the voltage at the output node of said sensing means with the reference voltage at the output node of said reference voltage generating means and to issue a signal indicating the specified status of the selected memory cell, characterized by that
 a first transistor under gate control by a voltage inverse to the voltage on the input node of said sensing means, is connected between the output and input nodes of said sensing means and that a second transistor under gate control by said inverse voltage is connected between the input node of said sensing means and the input node of said reference voltage generation means.

2. A semiconductor memory device of claim 1 wherein a third transistor under gate control by a voltage inverse to the voltage on said input node of said reference voltage generation means is connected between the output node and the input node of said reference voltage generation means.

3. A semiconductor memory device of claim 2 wherein said second transistor has a threshold value smaller than that of said first or third transistors.

4. A semiconductor memory device of claim 2 wherein said first, second and third transistors are N-channel type field effect transistors.

5. A semiconductor memory device of claim 2 wherein said first and third transistors are intrinsic transistors having a threshold voltage of about 0 V and said second transistor is an enhancement transistor.

* * * * *